(12) United States Patent
Kehret et al.

(10) Patent No.: US 8,427,828 B2
(45) Date of Patent: Apr. 23, 2013

(54) PRINTED CIRCUIT BOARD MODULE ENCLOSURE AND APPARATUS USING SAME

(75) Inventors: William E. Kehret, Oakland, CA (US); Dennis Henry Smith, Fremont, CA (US)

(73) Assignee: Themis Computer, Fremont, CA (US)

( * ) Notice: Subject to any disclaimer, the term of this patent is extended or adjusted under 35 U.S.C. 154(b) by 107 days.

(21) Appl. No.: 12/882,161

(22) Filed: Sep. 14, 2010

(65) Prior Publication Data

US 2012/0020017 A1 Jan. 26, 2012

Related U.S. Application Data

(60) Provisional application No. 61/366,036, filed on Jul. 20, 2010.

(51) Int. Cl.
*H05K 7/20* (2006.01)

(52) U.S. Cl.
USPC ............ 361/679.54; 361/679.46; 361/679.53; 361/714; 361/715; 361/727; 165/80.3; 165/104.33; 165/185

(58) Field of Classification Search ........... 361/679.46–679.54, 690–697, 361/688, 689, 704–712, 714; 165/80.3, 80.4, 165/104.33, 104.34, 185; 174/252–267, 174/15.1, 16.3; 312/223.2, 223.3, 236
See application file for complete search history.

(56) References Cited

U.S. PATENT DOCUMENTS

| | | | |
|---|---|---|---|
| 3,648,113 A | * | 3/1972 | Rathjen et al. ............... 361/707 |
| 3,865,183 A | * | 2/1975 | Roush ........................ 165/80.4 |
| 3,904,933 A | * | 9/1975 | Davis ........................... 361/689 |
| 4,004,194 A | | 1/1977 | Doerflinger et al. |
| 4,771,365 A | * | 9/1988 | Cichocki et al. ............. 361/705 |
| 4,930,045 A | * | 5/1990 | Carlson et al. ............... 361/329 |
| 5,060,113 A | * | 10/1991 | Jacobs ......................... 361/721 |
| 5,214,564 A | * | 5/1993 | Metzler et al. ............... 361/699 |
| 5,218,518 A | | 6/1993 | Deinhardt et al. |

(Continued)

OTHER PUBLICATIONS

"CX-Series [ARINC 404A]," Churchill Corporation, pp. 1-2 (Downloaded from the Internet Mar. 1, 2011).

(Continued)

*Primary Examiner* — Michail V Datskovskiy
(74) *Attorney, Agent, or Firm* — Jenkins, Wilson, Taylor & Hunt, P.A.

(57) ABSTRACT

A modular electronic component includes a circuit board having disposed thereon one or more electronic components and an enclosure for housing the circuit board. The enclosure comprises a thermally conductive shell having front and back surfaces being substantially parallel to the plane of the circuit board and being disposed on opposite sides of the circuit board from each other, left and right surfaces being substantially perpendicular to the plane of the circuit board and being disposed on opposite sides of the circuit board from each other, and top and bottom surfaces being substantially perpendicular to the left and right surfaces and substantially perpendicular to the top and bottom surfaces and being disposed on opposite sides of the circuit board from each other. A thermal shunt comprised of a thermally conductive material is disposed between the circuit board and the front surface of the enclosure and provides a thermally conductive path between at least some of the electronic components and the front surface of the enclosure, where the front surface of the enclosure conducts heat to at least one of the top, left, and right surfaces of the enclosure.

13 Claims, 11 Drawing Sheets

U.S. PATENT DOCUMENTS

| | | | |
|---|---|---|---|
| 5,251,106 A | 10/1993 | Hui | |
| 5,323,292 A * | 6/1994 | Brzezinski | 361/689 |
| 5,396,403 A * | 3/1995 | Patel | 361/705 |
| 5,424,916 A * | 6/1995 | Martin | 361/698 |
| 5,541,448 A * | 7/1996 | Carpenter | 257/679 |
| 5,557,503 A | 9/1996 | Isaacs et al. | |
| 5,608,610 A * | 3/1997 | Brzezinski | 361/704 |
| 5,787,576 A * | 8/1998 | Warren et al. | 29/832 |
| 5,812,375 A * | 9/1998 | Casperson | 361/707 |
| 5,912,803 A * | 6/1999 | Dahl et al. | 361/704 |
| 6,018,456 A | 1/2000 | Young et al. | |
| 6,026,565 A * | 2/2000 | Giannatto et al. | 29/830 |
| 6,180,436 B1 * | 1/2001 | Koors et al. | 438/117 |
| 6,185,100 B1 * | 2/2001 | Bentz et al. | 361/704 |
| 6,201,700 B1 * | 3/2001 | Tzinares et al. | 361/719 |
| 6,252,726 B1 | 6/2001 | Verdiell | |
| 6,365,964 B1 * | 4/2002 | Koors et al. | 257/718 |
| 6,449,164 B1 | 9/2002 | Gershfeld | |
| 6,587,339 B1 * | 7/2003 | Daniels et al. | 361/690 |
| 6,587,346 B1 * | 7/2003 | Parker | 361/719 |
| 6,661,664 B2 * | 12/2003 | Sarno et al. | 361/719 |
| 6,781,830 B2 * | 8/2004 | Barth et al. | 361/688 |
| 6,862,180 B2 * | 3/2005 | Sawyer et al. | 361/690 |
| 7,057,896 B2 * | 6/2006 | Matsuo et al. | 361/704 |
| 7,180,737 B2 * | 2/2007 | Straub et al. | 361/690 |
| 7,372,701 B2 * | 5/2008 | Jacobson et al. | 361/714 |
| 7,450,384 B2 * | 11/2008 | Tavassoli et al. | 361/699 |
| 7,460,367 B2 * | 12/2008 | Tracewell et al. | 361/679.48 |
| 7,633,757 B2 * | 12/2009 | Gustine et al. | 361/714 |
| 7,643,309 B1 * | 1/2010 | Lebo | 361/796 |
| 7,813,134 B2 * | 10/2010 | Katsuro | 361/714 |
| 7,995,346 B2 * | 8/2011 | Biemer et al. | 361/726 |
| 8,023,267 B2 * | 9/2011 | Streyle et al. | 361/707 |
| 8,059,409 B2 * | 11/2011 | Steenwyk et al. | 361/710 |
| 8,130,496 B2 * | 3/2012 | Dong et al. | 361/700 |
| 2002/0158330 A1 * | 10/2002 | Moon et al. | 257/707 |
| 2002/0186544 A1 | 12/2002 | Tzlil et al. | |
| 2004/0212964 A1 | 10/2004 | Belady et al. | |
| 2008/0174960 A1 * | 7/2008 | Kehret et al. | 361/696 |
| 2009/0260777 A1 | 10/2009 | Attlesey | |
| 2010/0097767 A1 | 4/2010 | Jude et al. | |
| 2010/0187188 A1 * | 7/2010 | Ghalib | 210/764 |
| 2010/0195281 A1 * | 8/2010 | Lum | 361/679.52 |
| 2010/0212864 A1 * | 8/2010 | Tsai et al. | 165/80.3 |
| 2010/0290186 A1 * | 11/2010 | Zeng et al. | 361/694 |
| 2010/0320187 A1 * | 12/2010 | Griffin et al. | 219/209 |
| 2011/0187188 A1 * | 8/2011 | Yang | 307/31 |

OTHER PUBLICATIONS

"ATR (Air Transport Rack)," www.elma.com, pp. 27-30 (Downloaded from the Internet Jun. 16, 2010).

"Express-ATR," http://www.adlinktech.com/ampro/, p. 1-1 (Downloaded from the Internet May 27, 2010).

Trapassi, "Case Study: ATR Design Tackles Thermal Hurdles," COTS Journal, pp. 1-4 (Apr. 2004).

Notification of Transmittal of the International Search Report and the Written Opinion of the International Searching Authority, or the Declaration for International Application No. PCT/US2011/030604 (Apr. 6, 2012).

* cited by examiner

PRINTED CIRCUIT BOARD MODULE ENCLOSURE AND APPARATUS USING SAME

PRIORITY CLAIM

This application claims the benefit of U.S. Provisional Patent Application Ser. No. 61/366,036, filed Jul. 20, 2010; the disclosure of which is incorporated herein by reference in its entirety.

TECHNICAL FIELD

The subject matter described herein relates to modular, replaceable, and reusable electronic components. More particularly, the subject matter described herein relates to a printed circuit board module enclosure and an apparatus using same.

BACKGROUND

The subject technology is a novel miniaturization of a packaging system known in the electronics industry as an air transport rack, or ATR. These rack standards were initially used for radio equipment deployed on WWII aircraft. Over the years, these rack standards were adapted for packaging of digital computer components, in a similar class of service. A full ATR box has the following dimensions: width=25.7 cm, length=49.6 cm, height=19.4 cm.

Contemporary ATR boxes come in two lengths, long (49.6 cm) and short (42.0 cm), and come in a variety of widths, defined as a fraction of the width of a full ATR box. The widths include: 1 (25.7 cm), ¾ (19.1 cm), ½ (12.4 cm), ⅜ (9.0 cm), and ¼ (5.7 cm). A typical small ATR form factor is the "one half, short ATR", and is used to package 3U Euro-standard slot cards (least reparable units, LRUs).

As electrical components become increasingly miniaturized, however, the volume of even a quarter ATR box is needlessly large, and not only takes up valuable space within an aircraft but also contributes unnecessary weight. Furthermore, miniaturization of electrical components is often accompanied by an increase in power density and attendant thermal effects. Thus, simply packing more components into less space is an unworkable solution unless the problem of heat dissipation are also solved.

Conventional approaches to the problem of heat dissipation rely on air-cooling or water-cooling to dissipate the heat generated by densely packed electrical components. These approaches suffer significant weaknesses, however. Air cooling requires additional components, such as fans, filters, etc., that increase the cost and weight of the unit and which are additional components that may fail. The failure of a fan in particular can have a disastrous effect on the system operation. Water or liquid cooling is similarly expensive, heavy, and includes additional components that may fail.

Another conventional approach includes using heat spreaders to disperse heat away from the electronic components, usually to a heat sink. However, conventional systems that use heat spreaders suffer a significant weakness, as well: the heat spreader is coupled to the heat sink via the relatively small contact area of circuit board edges, which fit into shallow grooves in the heat sink. One popular approach uses Wedge-Lock® retainers, which are mounted to the printed circuit boards and are then inserted into channels machined into the cold plates or heat exchangers. The Wedge-Lock® system incurs some mechanical overhead, because the locking adapter must be mounted to the PCB and also because the system requires machined channels into which the locking adapters are inserted. As modules are scaled to smaller dimensions, this overhead becomes a larger and larger percentage of the total hardware. In addition, the contact surface through which heat may be transferred from the PCB to the cold-plate is limited to the width of the locking adapter portion, which limits the amount of heat conventional systems can dissipate. Because of the relatively small surface area provided for heat transfer, Wedge-Lock® systems have very high flux density. Moreover, as overall chassis volume is reduced, the Wedge-Lock® scheme does not scale at the same rate, thus occupying a relatively larger overhead, relative to the net available payload. In short, Wedge-Lock® systems are cumbersome, take up space, and are a potential point of failure.

Accordingly, in light of these disadvantages associated with conventional ATR boxes, there exists a need for a compact ATR form factor that includes enhanced thermal management capability. Specifically, there exists a need for a printed circuit board module enclosure and apparatus using same.

SUMMARY

According to one aspect, a modular electronic component includes a circuit board having disposed thereon one or more electronic components and an enclosure for housing the circuit board. The enclosure comprises a thermally conductive shell having front and back surfaces being substantially parallel to the plane of the circuit board and being disposed on opposite sides of the circuit board from each other, left and right surfaces being substantially perpendicular to the plane of the circuit board and being disposed on opposite sides of the circuit board from each other, and top and bottom surfaces being substantially perpendicular to the left and right surfaces and substantially perpendicular to the top and bottom surfaces and being disposed on opposite sides of the circuit board from each other. A thermal shunt comprised of a thermally conductive material is disposed between the circuit board and the front surface of the enclosure and provides a thermally conductive path between at least some of the electronic components and the front surface of the enclosure, where the front surface of the enclosure conducts heat to at least one of the top, left, and right surfaces of the enclosure.

According to another aspect, the subject matter described herein includes a modular electronic component system. The system includes a chassis for housing one or more modules for housing circuit boards, each module comprising a thermally conductive enclosure having front, back, left, right, and top surfaces and a circuit board disposed within the enclosure, where the plane of the circuit board is substantially parallel with the plane of the front and back surfaces and where the front surface of the module provides a path to conduct heat from the circuit board to the top, left, and right surfaces of the module. A backplane disposed along the bottom of the chassis provides one or more electrical connections to the modules. The backplane includes upward-facing electrical connectors for connecting to downward-facing electrical connectors disposed along the bottom surface of the modules, which are inserted downward into the chassis. The system includes a heat dissipation means being in physical contact with and for conducting heat away from at least one of the top, left, and right surfaces of the modules.

BRIEF DESCRIPTION OF THE DRAWINGS

Preferred embodiments of the subject matter described herein will now be explained with reference to the accompanying drawings, wherein like reference numerals represent like parts, of which.

DETAILED DESCRIPTION

In accordance with the subject matter disclosed herein, a printed circuit board module enclosure having a small form factor and having enhanced thermal management capabilities are provided, as well as an apparatus using same. The small form factor printed circuit board module and apparatus may be used to provide a small form factor air transport rack, herein referred to as a "nano air transport rack", abbreviated as "nano-ATR". A modularly pluggable electronic component system that uses the nano-ATR modules is also presented.

Reference will now be made in detail to exemplary embodiments of the subject matter described herein, examples of which are illustrated in the accompanying drawings. Wherever possible, the same reference numbers will be used throughout the drawings to refer to the same or like parts. In one embodiment, a nano-ATR module has dimensions of 1.25 cm×7.5 cm×8.9 cm. Table 1, below, shows a comparison of ATR box sizes.

TABLE 1

A comparison of ATR box sizes (cm)

| ATR SIZE | Width | Length | Height |
| --- | --- | --- | --- |
| ATR 1 Long | 25.7 | 49.6 | 19.4 |
| ATR 1 Short | 25.7 | 31.8 | 19.4 |
| ATR ¾ Short | 19.1 | 31.8 | 19.4 |
| ATR ½ Short | 12.4 | 31.8 | 19.4 |
| ATR ⅜ Short | 9.0 | 31.8 | 19.4 |
| ATR ¼ Short | 5.7 | 31.8 | 19.4 |
| ATR Dwarf | 5.7 | 31.8 | 8.6 |
| nano-ATR chassis | 9.0 | 9.5 | 9.0 |
| nano-ATR module | 1.9 | 8.9 | 7.5 |

For more accurate comparison, the sizes listed in Table 1 are for boxes without heat sinks, fins, cold plates, and the like, which vary in size according to the needs of a particular installation.

As shown in Table 1, above, the smallest standard ATR box size is the dwarf ATR box, having dimensions in centimeters of (5.7×31.8×8.6) and a volume of 1558.8 cubic centimeters. In contrast, a nano-ATR form factor module according to one embodiment of the subject matter described herein has dimensions in centimeters of (1.9×8.9×7.5), and a chassis according to one embodiment has dimensions in centimeters of (9.0×9.5×9.0) and a volume of 769.5 cubic centimeters—less than half the volume of the smallest standard ATR box, the dwarf ATR box. Modules of two slot pitches, 12.5 mm and 19 mm are described. Thus, the packaging system described is significantly more compact than the earlier "ATR" standard systems.

Figure 1A:
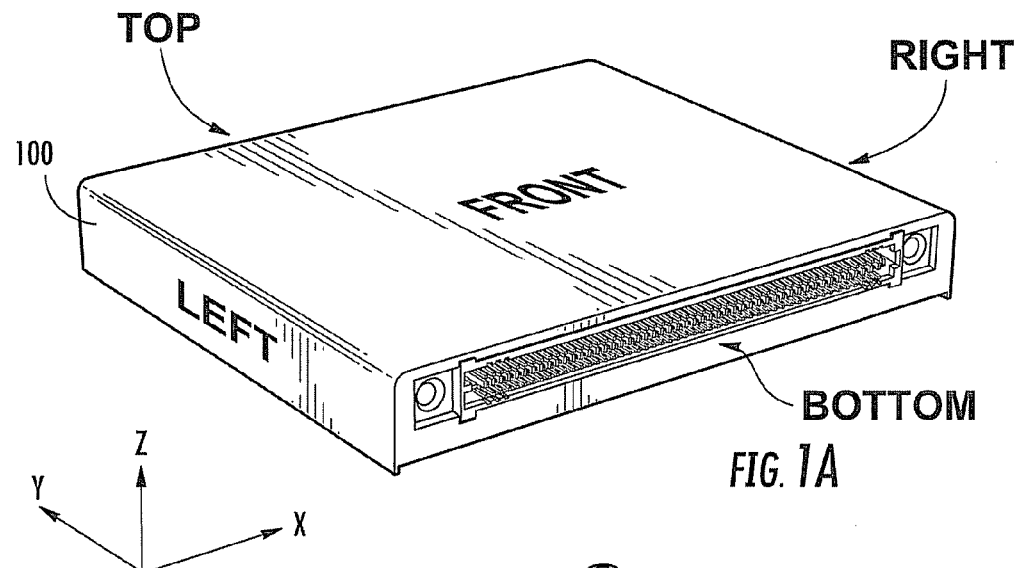
FIGS. 1A, 1B, and 1C illustrate various views of an exemplary modular electronic component ("module") according to an embodiment of the subject matter described herein.
Figure 1B:
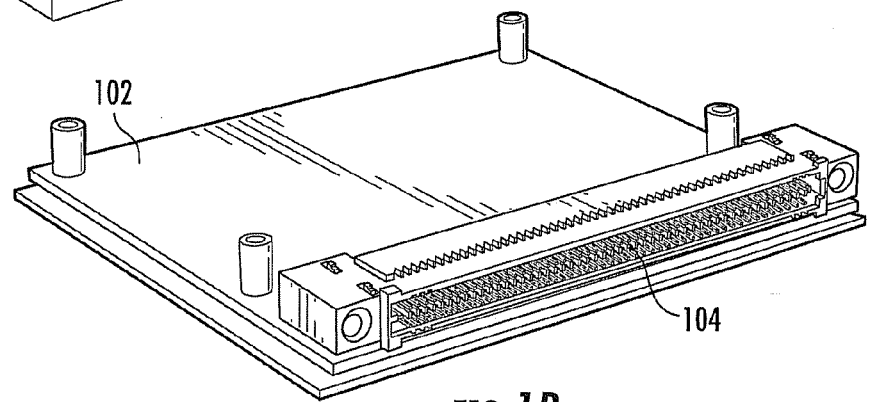
Figure 1C:
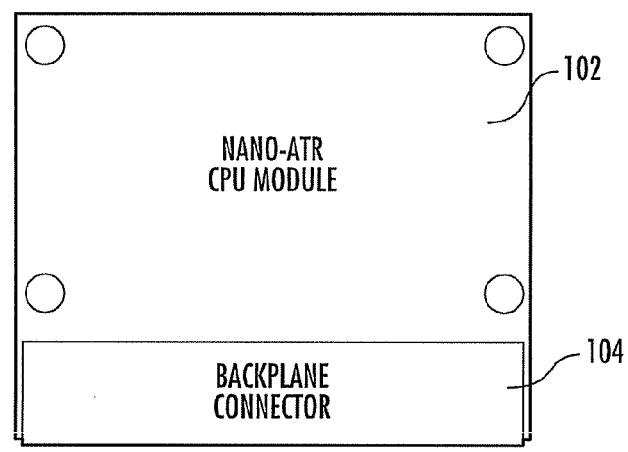

FIGS. 1A, 1B, and 1C illustrate an exemplary modular electronic component ("module") according to an embodiment of the subject matter described herein. FIG. 1A is an isometric view of a module 100 showing a backplane connector on the bottom surface of the module. FIG. 1B is an isometric view of module 100 with a portion of the outer shell removed to reveal a circuit board 102 and backplane connector 104 contained within. FIG. 1C is a plan view of circuit board 102 and backplane connector 104. In one embodiment, module 100 is an enclosure comprised of a thermally conductive shell, such as metal, composite, or other thermally conducting material. In FIG. 1A, module 100 is shown with its front, top, bottom, left, and right surfaces identified. The back surface is not shown, but is opposite to the front surface. In one embodiment, backplane connector 104 is attached to circuit board 102 such that when circuit board 102 is attached or mounted within module 100, the plane of circuit board 102 is substantially parallel to the front and back surfaces of module 100 and connector 104 is located at the bottom surface of module 100. In one embodiment, the X and Y dimensions of circuit board 102 are 84 mm and 70 mm, respectively, and module 100 has X and Y dimensions of 89 mm and 75 mm, respectively. In the embodiment illustrated in FIG. 1A, module 100 has a Z dimension of 12.5 mm.

Figure 2A:
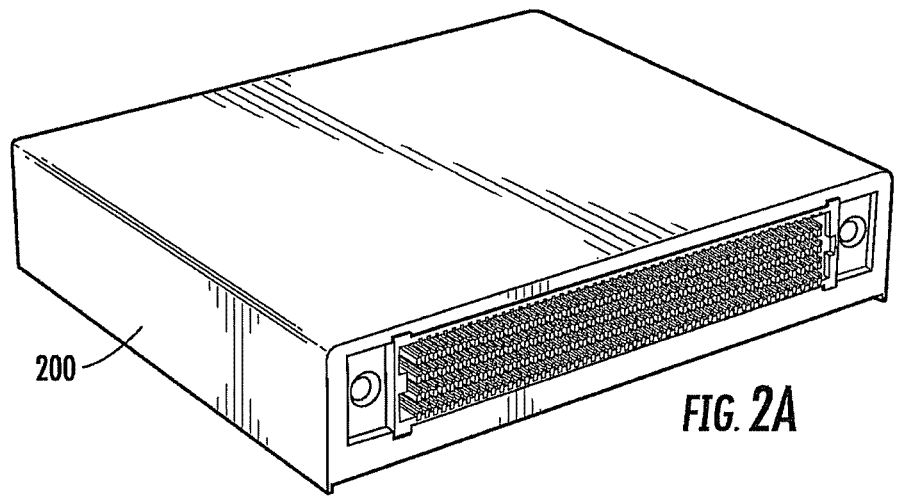
FIGS. 2A, 2B, and 2C illustrate various views of an exemplary modular electronic component according to another embodiment of the subject matter described herein.
Figure 2B:
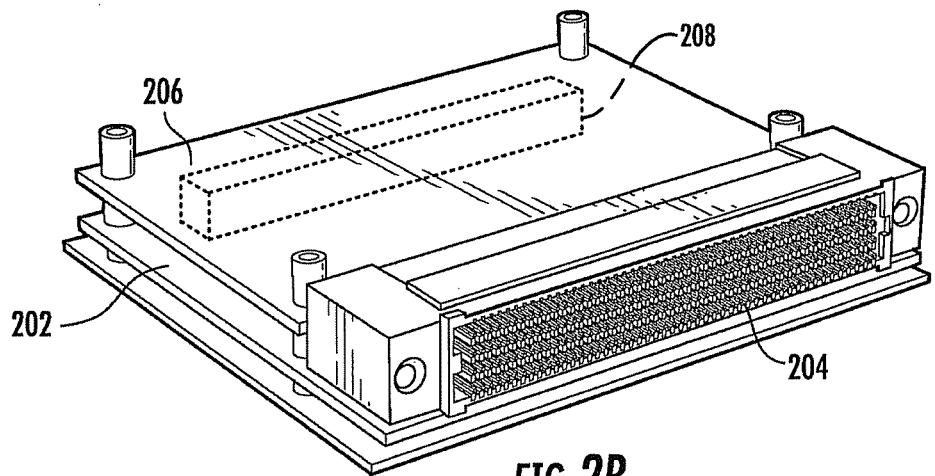
Figure 2C:
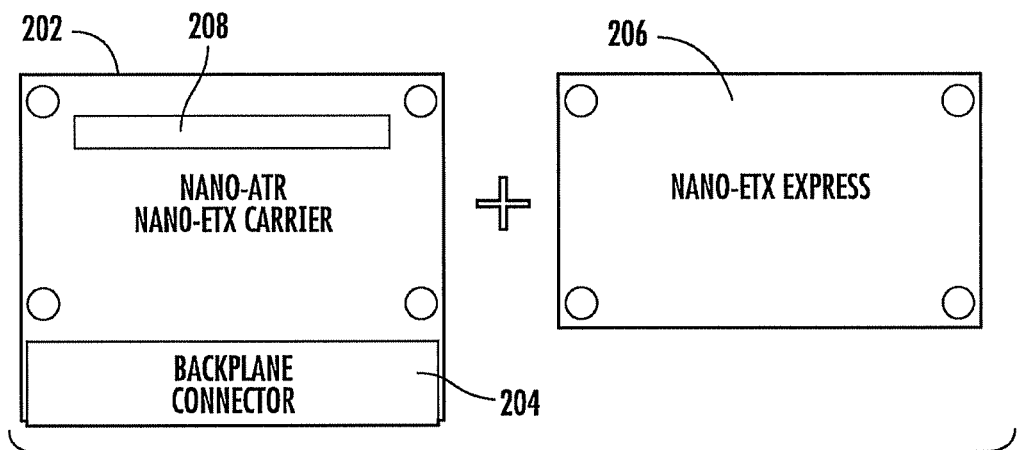

FIGS. 2A, 2B, and 2C illustrate an exemplary modular electronic component according to another embodiment of the subject matter described herein. FIG. 2A is an isometric view of a module 200 showing a backplane connector on the bottom surface of the module. FIG. 2B is an isometric view of module 200 with a portion of the outer shell removed to reveal a first circuit board 202, which may also be referred to as carrier board 202, and backplane connector 204 contained within. Module 200 also includes a second circuit board 206, which may also be referred to as mezzanine card 206, that connects to first circuit board 202 via a second connector 208, which may also be referred to as mezzanine connector 208. The first and second circuit boards may be respectively referred to as a mother and daughter card pair, or a carrier and mezzanine card pair, etc. FIG. 2C is a plan view of carrier board 202 with its backplane connector 204 and mezzanine connector 208 and of mezzanine card 206.

In one embodiment, module 200 is comprised of a thermally conductive shell, such as metal, composite, or other thermally conducting material. In one embodiment, the dimensions of carrier board 202 are 84 mm×70 mm, the dimensions of mezzanine card 206 are 84 mm×55 mm, and the dimensions of module enclosure 200 are 89 mm×75 mm×19 mm. In one embodiment, mezzanine card 206 complies with the nano-ETX express standard.

Figure 3:
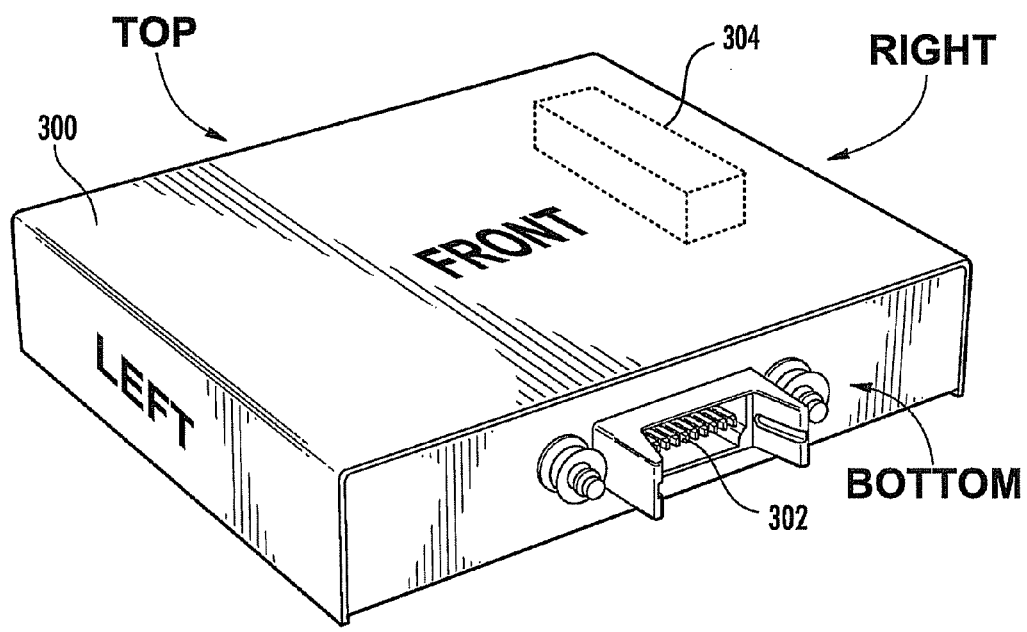
FIG. 3 is an isometric view of an exemplary stand-alone modular electronic component according to another embodiment of the subject matter described herein.

FIG. 3 is an isometric view of an exemplary modular electronic component according to another embodiment of the subject matter described herein. Stand-alone module 300 encloses one or more circuit boards and uses the thermally conducting shell and internal skyline structure to provide a large surface area, e.g., the front, back, left, right, top and bottom surfaces of the shell by which heat may be dissipated. Stand-alone module 300 includes a connector 302 disposed within the bottom of the module for providing an electrical connection to the circuit board(s) enclosed within. In one embodiment, stand-alone module 300 may be self-sufficient, i.e., not requiring external support. For example, stand-alone module 300 may contain its own internal power source. In one embodiment, stand-alone module 300 may contain an internal power supply, such as batteries, in which case stand-alone module 300 does not require an external power source. Stand-alone module 300 may include a power converter for converting power that is supplied from internal batteries, supplied from an external source via connector 302, or both, into power suitable for use by the module components, including conversions from AC to DC, conversions from DC to DC, changes in voltage or current levels, power conditioning, providing auxiliary or backup power, and the like. In one embodiment, stand-alone module 300 may be sealed. Pluggable modules 100 and 200 may also be sealed against air, water, contaminants, etc.

Figure 4A:
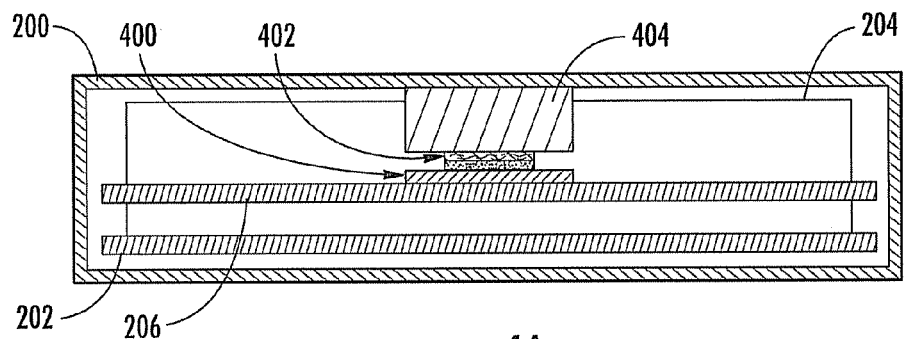
FIGS. 4A, 4B, and 4C illustrate top, cross sectional views of exemplary modular electronic components according to embodiments of the subject matter described herein.
Figure 4B:
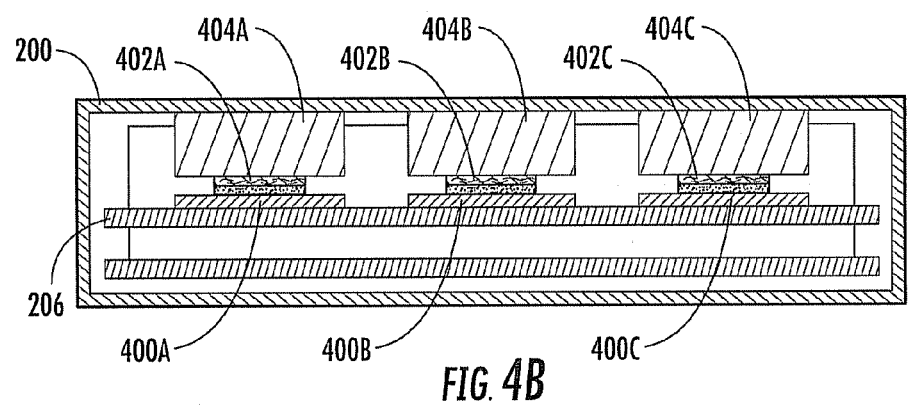
Figure 4C:
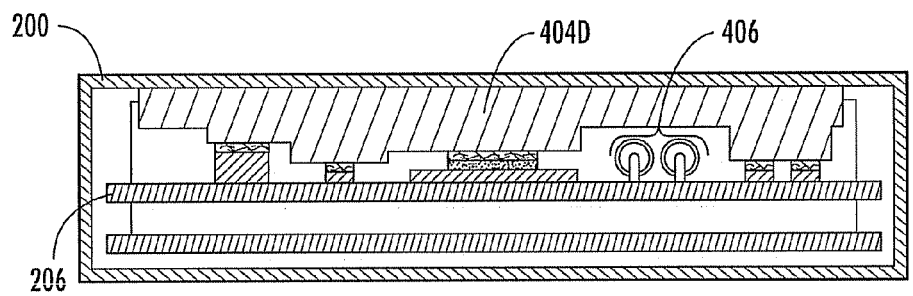

FIGS. 4A, 4B, and 4C illustrate top, cross sectional views of exemplary modular electronic components according to embodiments of the subject matter described herein. In each of FIGS. 4A, 4B, and 4C, the top cross-sectional view of module 200 shows the thermally conductive shell 200, a carrier board 202, connector 204, and mezzanine card 206. The same principles of thermal transfer via a thermally conductive shell may be utilized by other embodiments, such as modules 100 and 300, as well.

In the embodiment illustrated in FIG. 4A, mezzanine card 206 includes a component 400, which may be surface mounted to mezzanine card 206. For example, component 400 may be a ball grid array package or other form of chip carrier upon which is mounted an integrated circuit, which may be encased in plastic or other material. The embodiment illustrated in FIG. 4A, the chip carrier is shown as a rectangle filled with diagonal lines and the material encasing the integrated circuit is shown as a rectangle filled with a stipple pattern, but other types of components are contemplated also.

A thermally conductive material 402 provides a thermal interface between component 400 and a thermally conductive shunt (the "thermal shunt") 404 that is attached to the inside front surface of module 200. In one embodiment, thermal shunt 404 may be a rigid material, such as aluminum, and thermally conductive material 402 may be a compliant material, designed to guarantee contact between component 400 and thermal shunt 404. For this reason, thermally conductive material 402 may be referred to as a "thermal gasket." Module 200 may have more than one component, however.

In one embodiment, a thermally conductive heat spreader may be interposed between thermal shunt 404 and an inside surface of thermally conductive shell 200, to provide additional volume of thermally conductive material through which heat may be transferred from thermal shunt 404 to shell 200, and to provide additional thermal contact area to shell 200. Such a heat spreader can help distribute the heat away from a concentrated heat source, such as component 400, across and through the entire surface or surfaces of thermally conductive shell 200, increasing the efficiency of heat transfer way from circuit board 206.

FIG. 4B shows an alternative embodiment of module 200, which includes multiple components 400A, 400B, and 400C, each with its own thermal gasket 402A, 402B, and 402C, respectively, and each with its own thermal shunt 404A, 404B, and 404C, respectively.

FIG. 4C shows yet another alternative embodiment of module 200, which includes a variety of components (shown as black rectangles), each with its own thermal gasket but sharing a common thermal shunt 404D. In the embodiment illustrated in FIG. 4C, thermal shunt 404D follows the contours of the underlying components, extending toward mezzanine board 206 when necessary to reach a component and extending away from mezzanine board 206 when it is necessary to avoid or clear other structures 406 that should not make contact with thermal shunt 404D. The resulting contour of thermal shunt 404D is reminiscent of a city skyline, and for this reason this type of thermal shunt (and thermal gasket) may be referred to as a "skyline structure". The thermal shunt and thermal gasket design may be used within single circuit board module 100 and stand-alone module 300 as well.

Figure 4D:
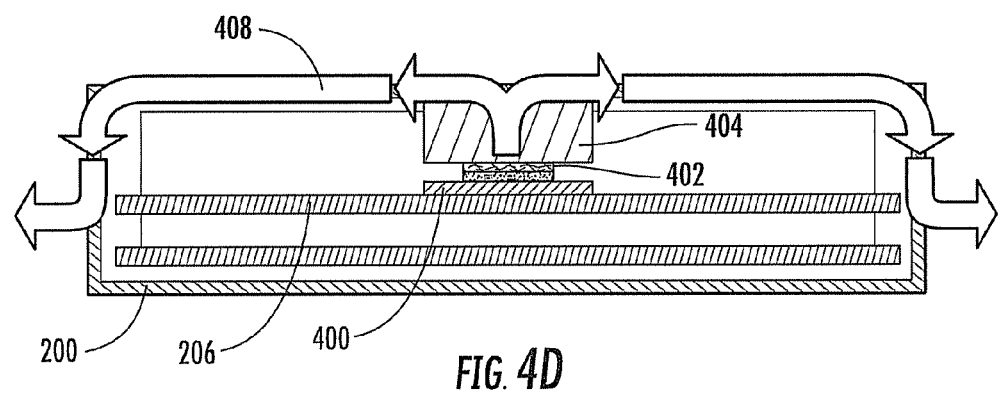
FIGS. 4D and 4E illustrate the paths of heat conduction through an exemplary modular electronic component according to an embodiment of the subject matter described herein, including a top, cross sectional view and an isometric view of a module.

FIG. 4D is another view of the module illustrated in FIG. 4A, showing the path of heat conduction 408 from component 400 on mezzanine card 206, through thermal gasket 402 and thermal shunt 404 to the front surface of module 200. Heat is dissipated from the front surface of module 200 to the left and right sides of module 200, where a heat sink or other heat dissipation means will allow the heat to conduct away from module 200.

Although FIGS. 4A through 4D illustrate embodiments having two circuit boards, such as mother board 202 and daughter card 206, the subject matter described herein is not so limited. The skyline structure 404 and thermal gasket 402 illustrated in FIG. 4A, for example, may likewise be employed to provide a thermally conductive path away from components located on modules having only a single circuit board, such as circuit board 102 within module 100, as illustrated FIGS. 1A through 1C. The same principle may be likewise applied to modules having any number of circuit boards contained within.

Figure 4E:
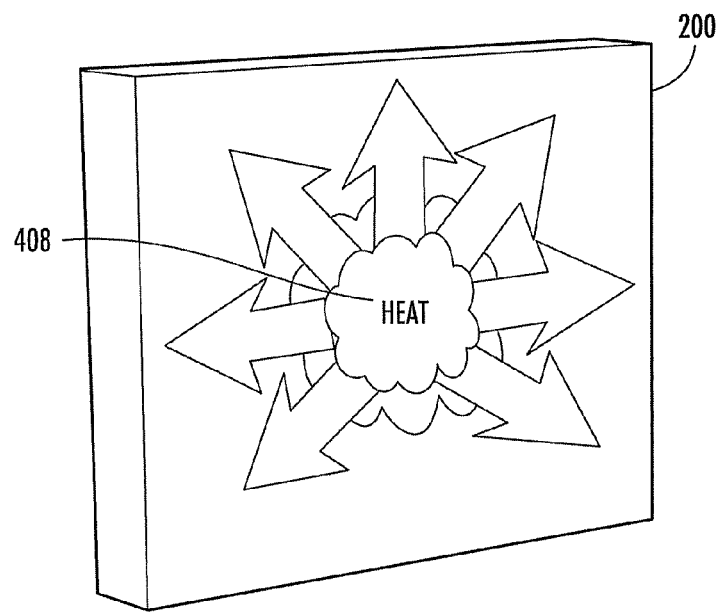

FIG. 4E is an isometric view of module 200, showing that heat is dissipated not only to the left and right surfaces of module 200 but also to the top surface. If the enclosure has a bottom surface, heat may be dissipated to the bottom surface as well. Heat sinks may be located on the left, right, and top surfaces of module 200, and also may be located on the bottom surface or even the front or back surfaces as well. By using a thermally conducting shell in combination with the skyline structure, a substantial amount of surface area can either dissipate heat directly or can provide contact area for a heat sink, cold plate, or other cooling structure.

Figure 5A:
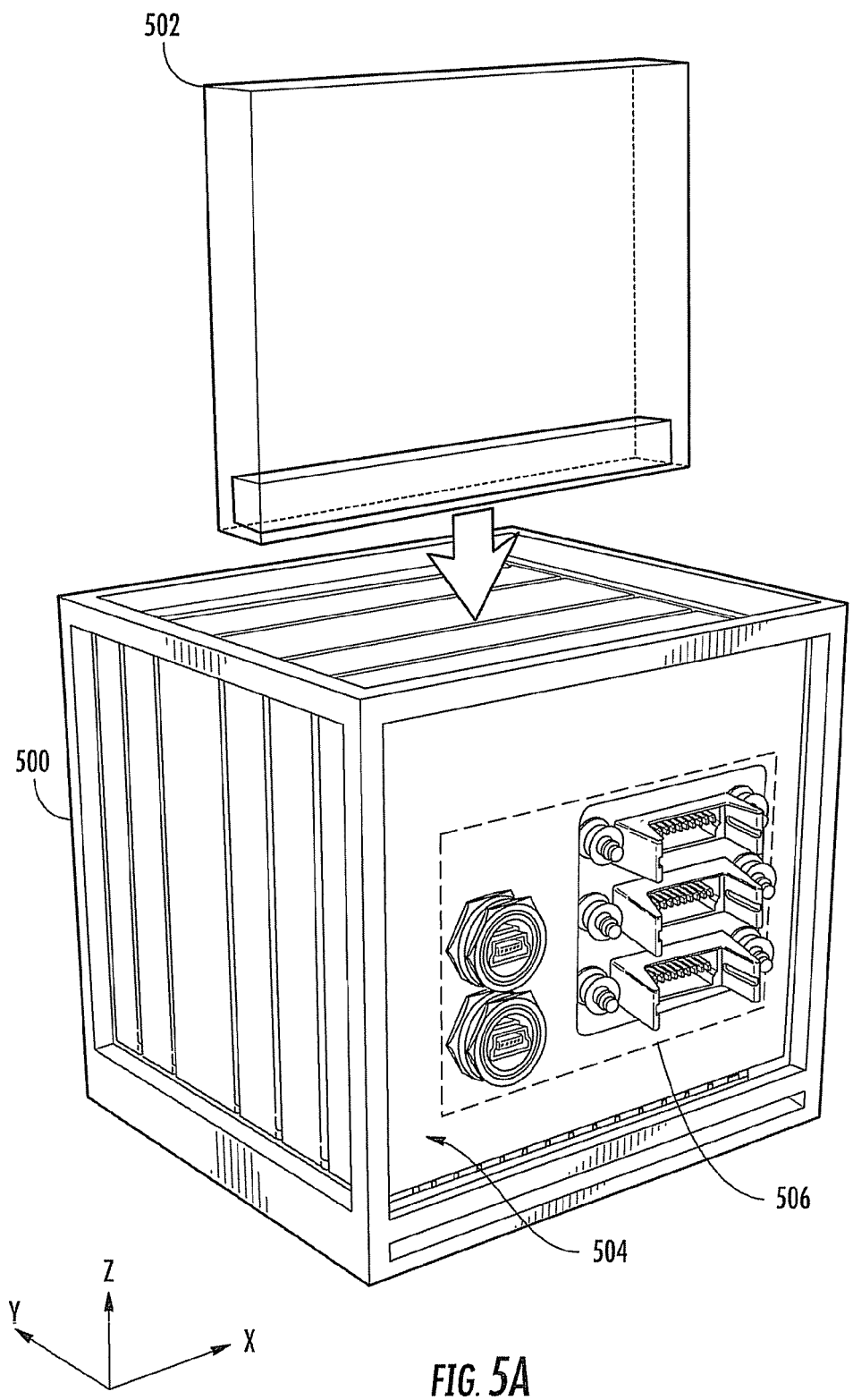
FIG. 5A is an isometric view of a modularly pluggable electronic component system according to an embodiment of the subject matter described herein.
Figure 5B:
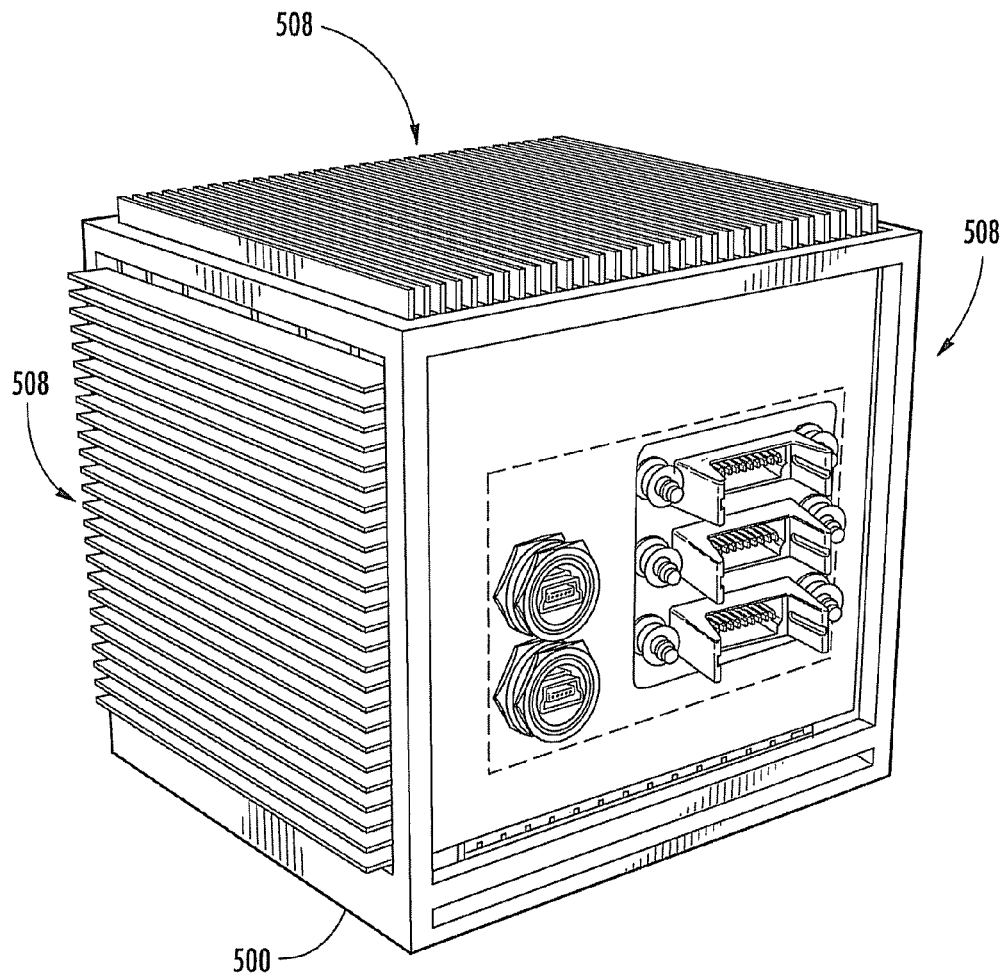
FIG. 5B is an isometric view of the modularly pluggable electronic component system illustrated in FIG. 5A, with finned heat sinks attached.

FIGS. 5A, 5B, and 4C illustrate views of a modularly pluggable electronic component system according to an embodiment of the subject matter described herein.

FIG. 5A illustrates an isometric view of a chassis 500 for holding pluggable modules 502. In the embodiment illustrated in FIG. 5A, modules 502 are inserted downward into the top of chassis 500, such that a connector disposed at the bottom of module 502 makes contact with a mating connector located along the inside bottom of chassis 500. An arrow indicates the direction of insertion. In one embodiment, this connector provides one or more electrical connections between a backplane (not shown) within chassis 500 and electronic components within module 502. An I/O connector panel module 504 may be disposed at the front of chassis 500, and may include electrical connections 506 to the backplane and, by extension, to components within the modules 506.

In the embodiment illustrated in FIG. 5A, chassis 500 can accommodate multiple pluggable modules 502. In one embodiment, the pluggable modules are stacked along an axis that goes through the front and back surfaces of the modules, i.e., stacked in a "front to back" orientation. Side-to-side and front-to-back motion of modules 502 is constrained by the chassis frame and associated heat dissipation structures. Heat generated within modules 502 will be conducted to their front surfaces by skyline structures within the modules, and the heat will be conducted through the front surface of each module to the left, top, and right side surfaces of the modules. From there, the heat may be dissipated away from the modules. FIG. 5A shows a chassis without additional heat dissipation structures, but such structures are contemplated by the subject matter described herein. A chassis with heat dissipation means attached is shown in FIG. 5B.

FIG. 5B illustrates an isometric view of a chassis 500 for holding pluggable modules 502, showing attached heat dissipation means 508. In the embodiment illustrated in FIG. 5B, heat dissipation means 508 are finned heat sinks that are attached to the top, left, and right sides of chassis 500. Other possible heat dissipation means include water cooled systems, contact with a cold plate or other refrigeration systems, heat pipes or other devices which use convection or recirculation of a coolant, with or without active pumping systems, and so on.

In contrast to Wedge-Lock® systems, where a locking adaptor is secured within a slot that is machined into the heat sink or cold plate, heat dissipation means 508 does not require precisely machined channels. Instead, heat dissipation means 508 need only make contact with the target surface of the modules—no channels or grooves are needed, reducing manufacturing costs. In addition, the entirety of the target surface of each module makes contact with heat dissipation device. Because the contact surface area is 5~10 times larger when compared to a Wedge-Lock® system, the flux density is correspondingly lower, i.e., 5~10 times lower than for a Wedge-Lock® system. This results in lower heat path loss and therefore better heat dissipation than would be achieved using a Wedge-Lock® system.

Figure 5C:
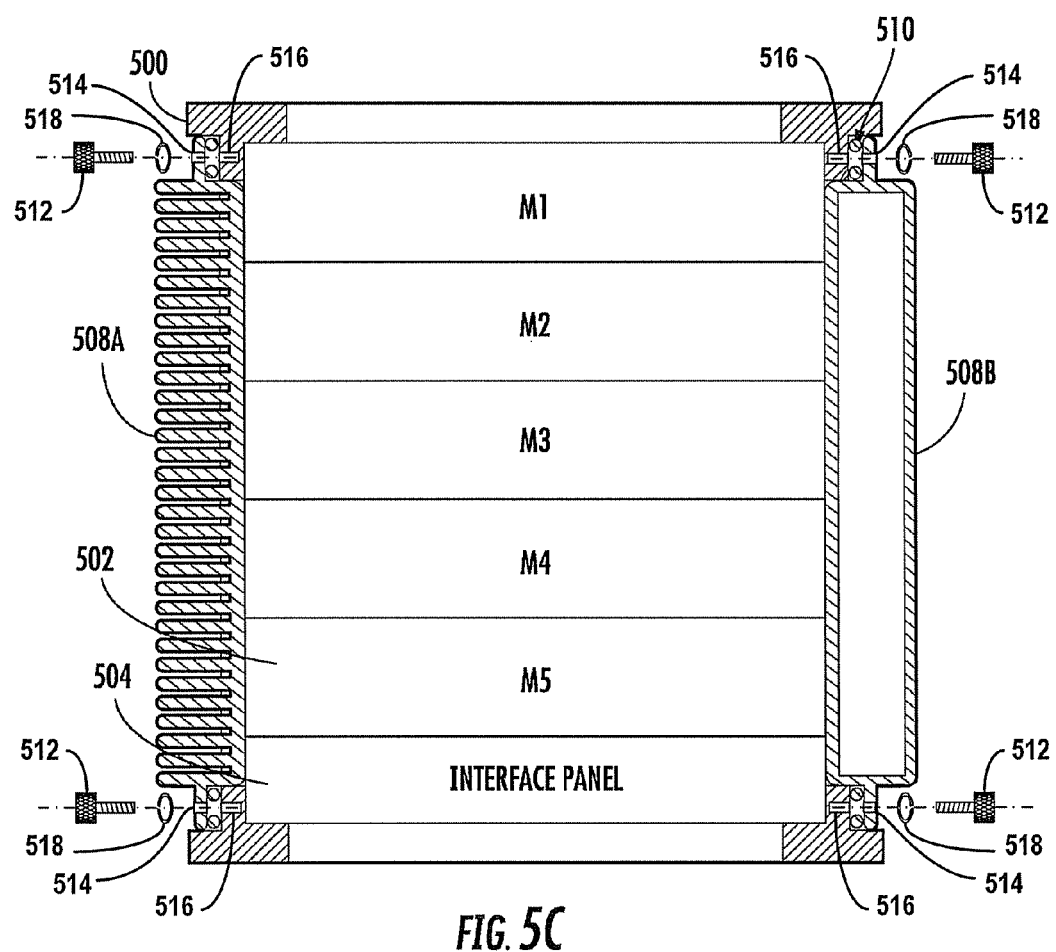
FIG. 5C is a top view of the modularly pluggable electronic component system illustrated in FIG. 5B, with the top heat sink removed.

FIG. 5C illustrates a top view of a modularly pluggable electronic component system according to an embodiment of the subject matter described herein. FIG. 5C shows a top view of chassis 500 with left and right heat dissipation means 508A and 508B, respectively, attached. In FIG. 5C heat dissipation means 508A and 508B are finned heat sinks. For clarity, a top heat sink is not shown. In one embodiment, heat sinks may be mounted to the back and bottom surfaces of chassis 500, also not shown in FIG. 5C.

In one embodiment, the frame elements of chassis 500 form an open box-like structure such that the top, left, and right sides of chassis 500 provide an opening or window into which the heat sinks are inserted. The window may have an inset ledge to restrict movement of the heat sink along the plane of the module surfaces with which the heat sink makes contact and against which the heat sink may be firmly mounted. In the embodiment illustrated in FIG. 5C, a gasket or seal 510 may be disposed between the heat sink and the inset ledge to provide a seal against dust or other contamination.

In one embodiment, the heat sinks may be mounted to chassis 500 using screws or other attachment means. For example, the heat sinks may be attached to chassis 500 using captive screws 512 inserted through holes 514 in each corner of the heat sink and screwed into threaded holes 516 within the chassis frame. In one embodiment, a compliant washer 518 or spring may be used between the screw head and the heat sink, to compress the heat sink onto surfaces of the modules M1 through M5. For example, in the embodiment illustrated in FIG. 5C, heat sink 508A is compressed against the left surfaces of modules M1~M5, and heat sink 508B is compressed against the right surfaces of modules M1~M5. A top heat sink, not shown, would be compressed against the top surfaces of modules M1~M5. In one embodiment, a thermal interface material, such as a thermal gasket or thermal paste, may be located between the modules and the heat sinks, to ensure that the modules and heat sinks contact each other using the maximum surface area available and that these areas make good thermal contact with each other. In an alternative embodiment, a thermal interface material is not used, and the heat sinks make direct contact with the module enclosures.

Alternative embodiments include, but are not limited to, configurations in which the modules are stacked along an axis that goes through the left and right surfaces of the modules, i.e., in a "side by side" orientation, configurations in which the modules are arranged in a row and column or two dimensional (2D) matrix formation, configurations in which the modules are arranged in a three dimensional (3D) matrix formation, configurations in which the modules are arranged in a radial formation, or any other configuration in which one or more of the surfaces of the modules are made available for contact with the heat sinks or other heat dissipation means.

Figure 6A:
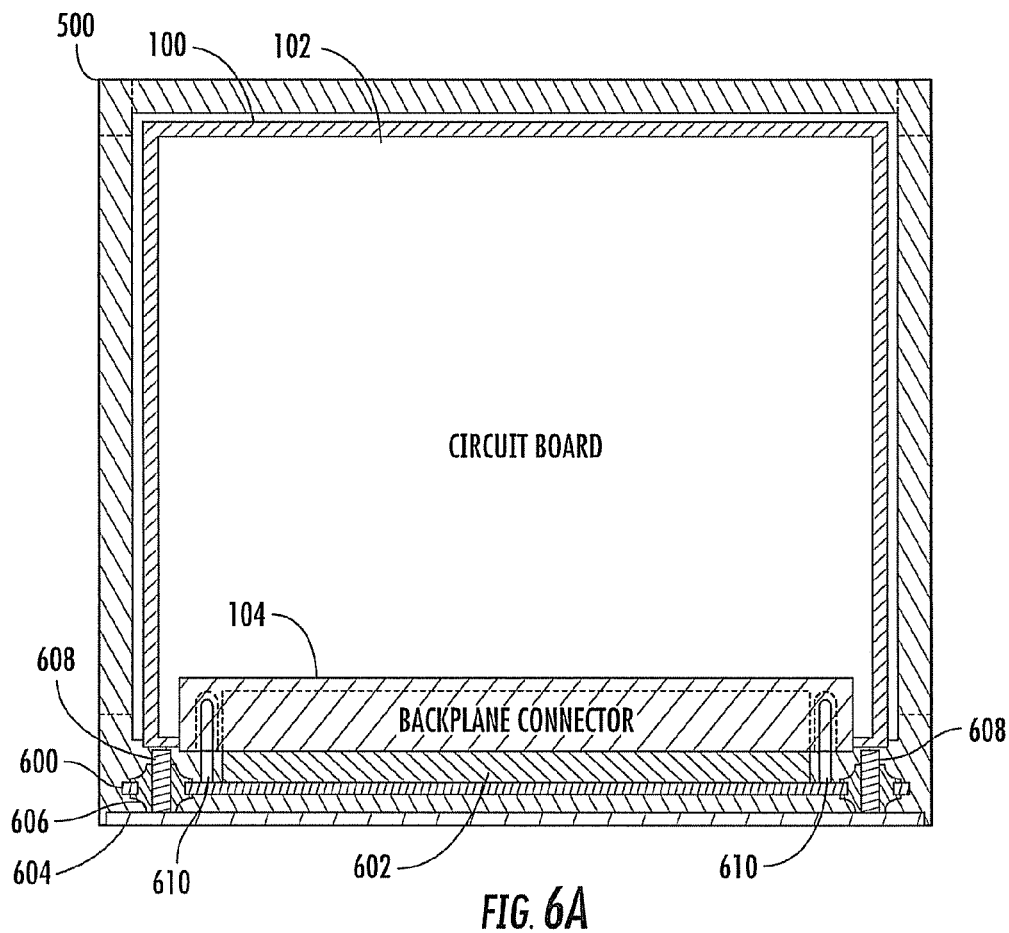
FIG. 6A is a elevation cross sectional view of an exemplary modular electronic component as illustrated in FIG. 1 installed in a modularly pluggable electronic component system as illustrated in FIG. 4A according to an embodiment of the subject matter described herein.

FIG. 6A is an elevation cross sectional view of an exemplary modular electronic component as illustrated in FIG. 1 installed in a modularly pluggable electronic component system as illustrated in FIG. 6A according to an embodiment of the subject matter described herein. In the embodiment illustrated in FIG. 6A, a module is seen in cross section, showing a thermally conductive shell 100 within which is housed a circuit board 102 to which a backplane connector 104 is attached. The module has been inserted into chassis 500 in a downward direction, such that backplane connector 104 within the module is electrically connected to a backplane 600 via a mating connector 602 located on the top surface of backplane 600. In the embodiment illustrated in FIG. 6A, backplane 600 is mounted to inside bottom surface 604 of chassis 500 using resilient mounts 606, which allow backplane 600 to "float" within chassis 500.

In one embodiment, resilient mounts 606 isolate backplane 600 from chassis 500, while circuit board 102 is hard-mounted to each module's conductive shell 100, so as to ensure that the skyline structure makes firm contact between the components on circuit board 102 and the module's conductive shell 100. In this manner, the circuit board and module are rigidly connected, such that when the module (and other modules) are rigidly attached to the chassis, e.g., via the compression-mounted heat sinks, the module enclosures, chassis, and heat sinks move together as a unit, while the backplane 600 and backplane connectors 602 move or "float" independently, and are thus isolated from the shock and vibration to which the chassis may be subjected. This isolation protects the critical electrical connections from damage or disruption due to externally applied stresses. Resilient mounts 606 may take many forms, including isolating grommets, a resilient pad or shoe that isolates the entire backplane, etc.

In one embodiment, mechanical stops 608 may protrude from the chassis bottom surface 604 and through backplane 600 to provide a structure against which the modules rest or against which the modules may be pressed. Mechanical stops 608 provide a path for Z-axis strain that bypasses the backplane connectors.

In one embodiment, gathering structures 610 guide the connection of a modules backplane connector 104 to its mating connector 602 during insertion of the module into chassis 500. In the embodiment illustrated in FIG. 6A, a guide pin, post, or cone 610 mounted to backplane 600 may align with cavities within or associated with backplane connector 104 during insertion so as to place the two connectors in proper alignment. Alternative gathering structures 610 may be used. For example, guide pins, posts, or cones 610 may be integral to mating connector 602, or they may be separate from mating connector 602. Likewise, the positions of the male and female portions of the connectors may be swapped, etc.

The combination of mechanical stops 608 and gathering structures 610 results in a modularly pluggable electronic component system which has a very reliable electrical connection between the modules and backplane 600. The Z-axis stress path bypasses electrical connectors 104 and 602, and the X-axis and Y-axis stresses are borne by the chassis and modules together. Even if X-axis, Y-axis, or Z-axis stress is somehow transferred through electrical connector 104 on circuit board 102 to electrical connector 602 on backplane 600, backplane 600 floats on resilient mounts 606, which absorb the stress by allowing connectors 104 and 602 to move in tandem, with the result that there is no force present that might separate the two connectors from each other or cause separation of a connector from the circuit board or backplane to which it is mounted. All of these features contribute to form a system in which failure of electrical connection between a module and the backplane due to stress, vibration, or separation is greatly reduced.

Figure 6B:
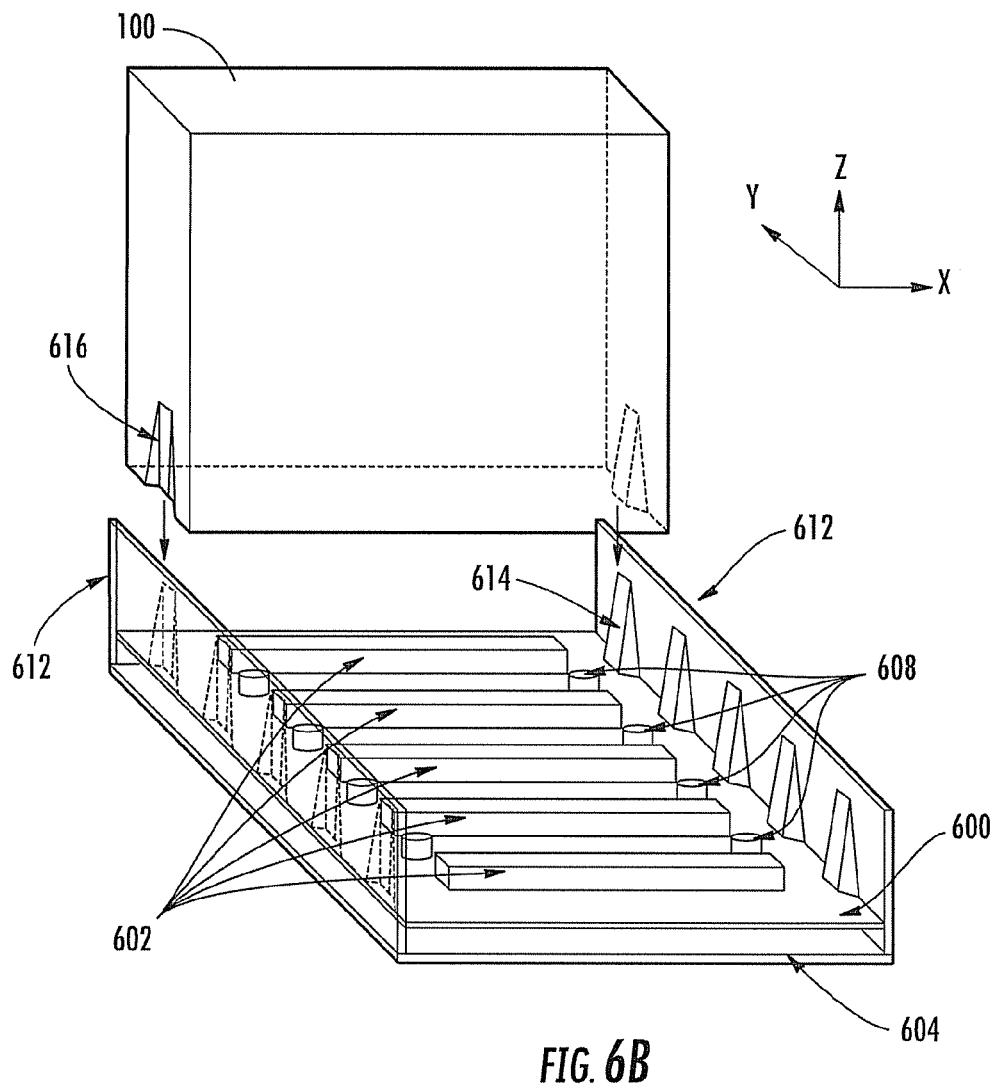
FIG. 6B illustrates a backplane with module connectors of a modularly pluggable electronic component system according to an embodiment of the subject matter described herein.

FIG. 6B illustrates a backplane with module connectors of a modularly pluggable electronic component system according to an embodiment of the subject matter described herein. Backplane 600 is mounted within a tray structure made up of the chassis bottom surface 604 along with left and right walls 612. In one embodiment, the top surface of backplane 600 includes module connectors 602 and clearance holes through which mechanical stops 608 protrude. Although not shown in FIG. 6B, each module 100 may have a mating backplane connector 104 on the bottom surface of the module. In the embodiment illustrated in FIG. 6B, tray walls 612 include alignment structures 614 that align within correspondingly shaped channels or notches 616 in each module enclosure 100. During insertion operations, alignment structures 614 start gathering and aligning the modules being inserted before guide pins 610 (not shown in FIG. 6B) begin to engage. Alignment structures 614 and channels 616 may help guide module 100 as it is being inserted into the chassis, and once the modules are inserted may provide stability to the modules, e.g., to restrict motion in the X-axis and/or Y-axis.

Alignment structures 614 may be located on any surface where the module and chassis may come in contact with each other, such as at the top or middle of the module enclosure, etc. Alignment structures 614 may be designed to ensure a desired separation between modules within the chassis, e.g., to provide thermal isolation from one module to another or to provide each module with additional isolation against shock or vibration.

The pitch or spacing of backplane connectors 602 may also vary according to configuration or need. For example, in one embodiment, backplane 600 may be designed to accept only 12.5 mm modules, while in another embodiment, backplane 600 may be designed to accept only 19 mm modules. Alternatively, backplanes 600 may be produced to accept a mix of module sizes including 12.5 mm, 19 mm, or any other module size deemed appropriate. The subject matter described herein is not limited to the specific module dimensions described above; the thermally conductive module enclosure and thermal skyline structure can be implemented in modules having larger or smaller dimensions as well, with corresponding changes to the chassis size.

Figure 7:
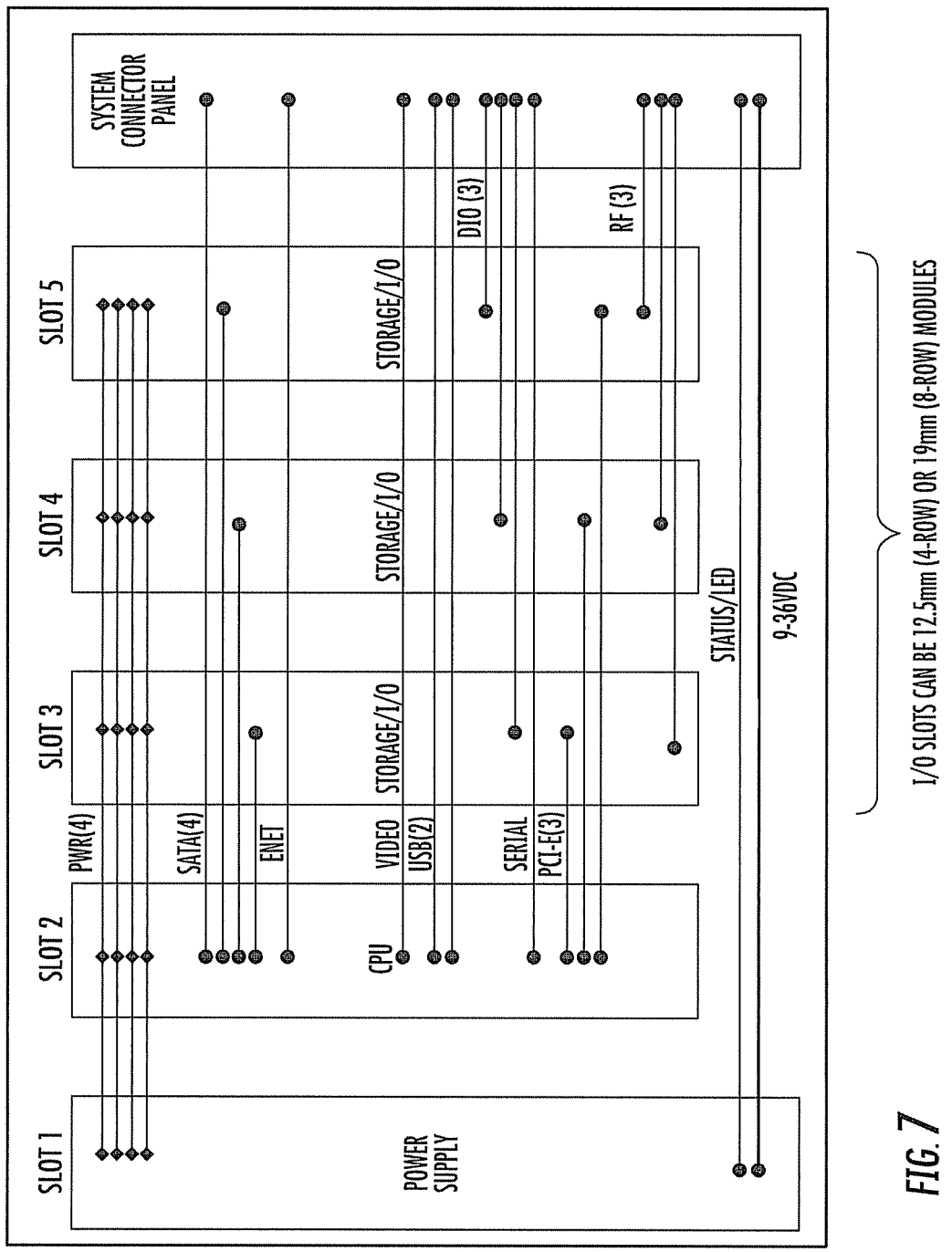
FIG. 7 is a backplane module interconnect diagram of a modularly pluggable electronic component system according to an embodiment of the subject matter described herein.

FIG. 7 is a backplane interconnect diagram for a modularly pluggable electronic component system according to an embodiment of the subject matter described herein. FIG. 7 illustrates an embodiment wherein a chassis includes five slots and a system connector panel. In this embodiment, slot 1 is occupied by a power supply module which provides power to remaining slots in the chassis via the four power supply lines labeled PWR(4) and provides both a power indication signal (status/LED) and a power connection (9-45 VDC) to the system connector panel. Slot 2 is occupied by a CPU module that provides serial ATA, or SATA, connections to each of the three slots 4 through 5 and to the system connector panel, and also provides PCI-E connections to each of slots 4, 4, and 5. The CPU module also provides an Ethernet (ENET) connection, a video connection, and two USB connections to the system connector panel. The system connector panel provides both data input/output (DIO) and RF connections to each of the modules in slots 4, 4, and 5. In the embodiment illustrated in FIG. 7, slots 4, 4, and 5 may accept a 12.5 mm module or a 19 mm module.

The configuration shown in FIG. 7 is not the only configuration contemplated by subject matter described herein. Other configurations and electrical connections are possible, depending on the backplane used. Together with the tray structure illustrated in FIG. 6B, this gives rise to the possibility of a system having a modular backplane, as well, e.g., a system wherein various backplanes may be swapped in and out of the chassis. The same principle may apply to the system connector panel, e.g., the system connector panel may be a replaceable module as well, with various combinations of connectors and connections as needed for the particular application. The connector panel may plug in along the "Z" axis or may plug in "endwise" on the "Y" axis. In one embodiment, a chassis may have more than one backplane. In one embodiment, each backplane may have connectors on both sides, e.g., in a two story, 5-up, 5-down configuration or be endwise contiguous, along Y axis. Other numbers of slots are also contemplated. For example, there may be various chassis sizes, having larger or smaller numbers of slots.

It will be understood that various details of the subject matter described herein may be changed without departing from the scope of the subject matter described herein. Furthermore, the foregoing description is for the purpose of illustration only, and not for the purpose of limitation.

What is claimed is:

1. A modularly pluggable electronic component system, comprising:
   a chassis for housing a plurality of modules that house circuit boards, each module comprising a thermally conducting enclosure having front, back, left, right, and top surfaces;
   a backplane disposed within a lower portion of the chassis for providing one or more electrical connections to the modules, the backplane having upward-facing electrical connectors for connecting to downward-facing electrical connectors disposed along the bottom surface of the modules that are inserted downward into the chassis; and heat dissipation means being in physical contact with and for conducting heat away from the at least one of the top, left, and right surfaces of the modules, wherein the heat dissipation means comprises a compression loaded side plate heat spreader.

2. The modularly pluggable electronic component system of claim 1 including a module for housing circuit boards, wherein the module for housing circuit boards comprises a circuit board secured within the module enclosure and includes at least one electrical connector, disposed within the bottom surface of the module, for connecting to at least one of the upward-facing electrical connectors on the backplane.

3. The modularly pluggable electronic component system of claim 1 wherein the heat dissipation means comprises a heat sink.

4. The modularly pluggable electronic component system of claim 3 wherein the heat sink includes fins for radiating heat.

5. The modularly pluggable electronic component system of claim 1 wherein the inserted modules are stacked along an axis through the front and back surfaces of the modules.

6. The modularly pluggable electronic component system of claim 1 wherein the modules are interlocked within the chassis.

7. The modularly pluggable electronic component system of claim 2 wherein the plane of the circuit board within the module is substantially parallel with the plane of the front and back surfaces of the module, wherein the circuit board includes one or more components, and wherein the front surface of the module provides a path to conduct heat from the one or more components to at least one of the top, left, and right surfaces of the module.

8. A modularly pluggable electronic component system comprising:

a chassis for housing a plurality of modules that house circuit boards, each module comprising a thermally conducting enclosure having front, back, left, right, and top surfaces;

a backplane disposed within a lower portion of the chassis for providing one or more electrical connections to the modules, the backplane having upward-facing electrical connectors for connecting to downward-facing electrical connectors disposed along the bottom surface of the modules that are inserted downward into the chassis; and heat dissipation means being in physical contact with and for conducting heat away from the at least one of the top, left, and right surfaces of the modules, wherein the chassis comprises a tray for mounting the backplane and for providing alignment to the modules.

9. The modularly pluggable electronic component system of claim 8 wherein the tray walls include guides for aligning modules during insertion of the modules and for maintaining the position of the modules within the chassis.

10. A modularly pluggable electronic component system comprising:

a chassis for housing a plurality of modules that house circuit boards, each module comprising a thermally conducting enclosure having front, back, left, right, and top surfaces;

a backplane disposed within a lower portion of the chassis for providing one or more electrical connections to the modules, the backplane having upward-facing electrical connectors for connecting to downward-facing electrical connectors disposed along the bottom surface of the modules that are inserted downward into the chassis;

heat dissipation means being in physical contact with and for conducting heat away from the at least one of the top, left, and right surfaces of the modules; and means for orienting the modules to the chassis.

11. The modularly pluggable electronic component system of claim 10 wherein means for orienting the modules to the chassis comprises at least one of:

conical or beveled structures proximate to the backplane connectors for engaging in receptacles disposed within the bottom surface of the modules; and conical or beveled structures disposed on the bottom surface of each module for engaging in receptacles proximate to the backplane connectors.

12. The modularly pluggable electronic component system of claim 10 wherein means for orienting the modules to the chassis comprises means for positioning modules in a predetermined orientation or location with respect to each other.

13. A modularly pluggable electronic component system comprising:

a chassis for housing a plurality of modules that house circuit boards, each module comprising a thermally conducting enclosure having front, back, left, right, and top surfaces;

a backplane disposed within a lower portion of the chassis for providing one or more electrical connections to the modules, the backplane having upward-facing electrical connectors for connecting to downward-facing electrical connectors disposed along the bottom surface of the modules that are inserted downward into the chassis; and heat dissipation means being in physical contact with and for conducting heat away from the at least one of the top, left, and right surfaces of the modules, wherein the heat dissipation means comprises a heat sink, and wherein the heat sink contains a recirculating liquid and/or gas.

\* \* \* \* \*